(12) United States Patent
Garcia

(10) Patent No.: US 6,973,183 B1
(45) Date of Patent: Dec. 6, 2005

(54) METHOD AND APPARATUS FOR DYNAMICALLY MATCHING IMPEDANCE

(76) Inventor: John D. Garcia, 4529 Stonewall, #125, Greenville, TX (US) 75401

( * ) Notice: Subject to any disclaimer, the term of this patent is extended or adjusted under 35 U.S.C. 154(b) by 591 days.

(21) Appl. No.: 09/798,094

(22) Filed: Mar. 1, 2001
(Under 37 CFR 1.47)

(51) Int. Cl.7 .............................................. H04M 7/04
(52) U.S. Cl. ..................................... 379/402; 379/403
(58) Field of Search .............................. 379/398, 402, 379/403, 404

(56) References Cited

U.S. PATENT DOCUMENTS 3,982,080 A * 9/1976 Ukeiley ...................... 379/403
4,103,118 A * 7/1978 Bergman .................... 379/403
4,757,530 A * 7/1988 Arnon ........................ 379/404
5,034,978 A * 7/1991 Nguyen et al. ............. 379/402

* cited by examiner

Primary Examiner—Sinh Tran
Assistant Examiner—Walter F Briney, III
(74) Attorney, Agent, or Firm—Baker Botts L.L.P.

(57) ABSTRACT

In one aspect of the invention a communication device including circuitry operable to facilitate dynamic impedance matching includes an image impedance operable to be coupled to a receiver/transmitter pair associated with a line impedance. The device also includes matching circuitry coupled to the line impedance and the image impedance, the matching circuitry operable to measure an impedance mismatch between the line impedance and the image impedance and to generate a control signal based on the measured impedance mismatch. The image impedance is operable to be varied to more closely match the line impedance based at least in part on the control signal.

28 Claims, 2 Drawing Sheets

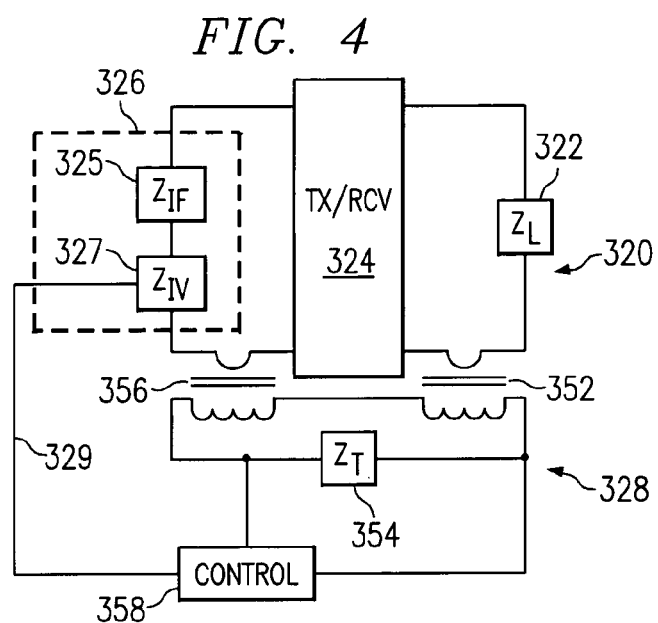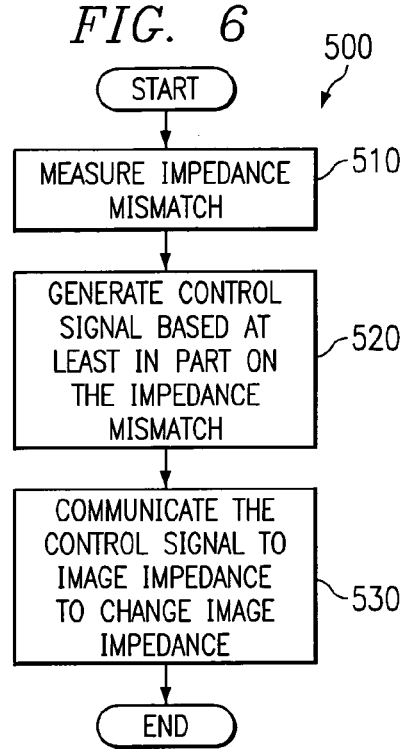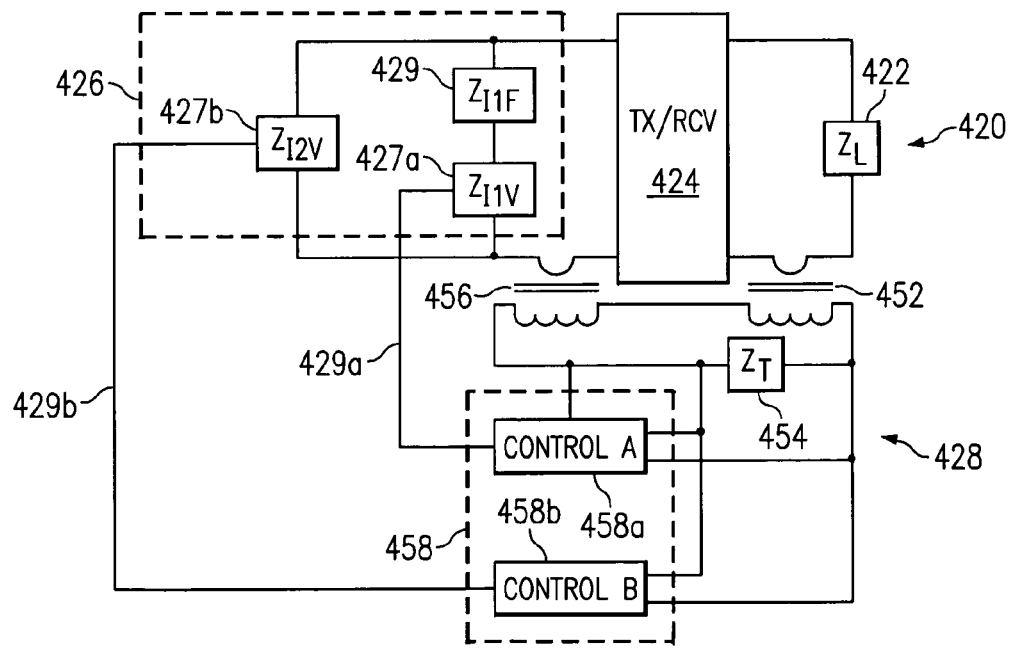

METHOD AND APPARATUS FOR DYNAMICALLY MATCHING IMPEDANCE

TECHNICAL FIELD OF THE INVENTION

The present invention relates to the field of communication systems, and more particularly to a system and method operable to facilitate dynamic impedance matching.

BACKGROUND OF THE INVENTION

Network elements communicating information over physical media typically see a line impedance, a source termination impedance, and a receiver impedance. To maximize system performance, these impedances should be matched with an image impedance, typically at the network element. Failure to match impedance can result in various undesirable consequences, such as crosstalk, in-band and out-of-band interferences, limitations on transmission range, and limitations on bit error rates (BER) associated with the system.

One approach to matching impedances has been to implement a static image impedance at the network element, whose value has been selected as a best guess impedance match for all situations. Real world transmissions systems' characteristics, however, rarely perfectly coincide with theoretical calculations, and often change over time. For example, bridge taps, discontinuities in wire gauge, discontinuities in the overall line, lengths of wire installed but unused or forgotten, and mismatched terminations can all create mismatches between a theoretical impedance match and actual impedance values.

Another approach that attempts to offer some flexibility in impedance matching is the use of static impedance matching tables. This technique, generally involves stepping through a finite number of predefined resistor values as a signal is communicated over the transmission medium and observing responses to the signal to determine which of the predefined resistor values gives the minimum return loss. This approach suffers for several reasons. For example, the limited number of potentially matching impedance values that can be stored in these tables inherently limits the range of impedance mismatches that can be corrected. The software and hardware involved with these tables can be complex and expensive to implement, particularly as table sizes increase in an attempt to match wider ranges of mismatches. In addition, no amount of tabular values can reallistically account for all real world situations. Moreover, this approach rarely accounts for any mismatch in complex impedance. Keeping the tables manageable generally requires that the tables contain only real impedance values.

In addition, to keep table sizes manageable, the tabular approach generally focuses on a particular narrow frequency range. This presents problems in wide band systems where impedance mismatches can occur at a much broader range of frequencies.

SUMMARY OF THE INVENTION

The present invention recognizes a need for a method and apparatus operable to facilitate dynamic impedance matching in a communication network. In accordance with the present invention, a system and method for providing dynamic impedance matching are provided that substantially reduce or eliminate at least some of the shortcomings associated with prior approaches.

In one aspect of the invention, a communication device including circuitry operable to facilitate dynamic impedance matching comprises an image impedance operable to be coupled to a receiver/transmitter pair associated with a line impedance. The device also includes matching circuitry coupled to the line impedance and the image impedance, the matching circuitry operable to measure an impedance mismatch between the line impedance and the image impedance and to generate a control signal based on the measured impedance mismatch. The image impedance is operable to be varied to more closely match the line impedance based at least in part on the control signal.

In another aspect of the invention, a communication device comprising circuitry operable to facilitate dynamic impedance matching comprises a first current transformer coupled to a line impedance, and a second current transformer coupled to an image impedance. The device further comprises a termination impedance coupled between the first and second current transformers and control circuitry coupled to the termination impedance. The control circuitry is operable to communicate to at least a portion of the image impedance a control signal based at least in part on a voltage across the termination impedance. The control signal is operable to affect a change in the image impedance so that the image impedance more closely matches the line impedance.

In yet another aspect of the invention, a method of dynamically matching impedances comprises measuring an impedance mismatch between a line impedance and an image impedance, and generating a control signal based at least in part on the measured impedance mismatch. The method further comprises communicating the control signal to the image impedance to cause the image impedance to more closely match the line impedance.

In another aspect of the invention, a method of manufacturing circuitry operable to facilitate dynamic impedance matching comprises coupling an image impedance to a receiver/transmitter pair associated with a line impedance, and coupling matching circuitry to the line impedance and the image impedance. The matching circuitry is operable to measure an impedance mismatch between the line impedance and the image impedance and to generate a control signal associated with the impedance mismatch. The method further comprises coupling the matching circuitry to the image impedance to facilitate communication of the control signal toward the image impedance and adjustment of the image impedance to more closely match the line impedance.

Depending on the specific features implemented, particular embodiments of the present invention may exhibit some, none, or all of the following technical advantages. For example, one aspect of the invention facilitates impedance matching for any arbitrary impedance mismatch. This feature can be valuable, for example, in situations resulting from impedance mismatches on lines that do not have representative impedances. For example, impedance mismatches caused by discontinuities in wire gage, discontinuities in the overall line, or mismatches caused by bridge taps along the line can be easily rectified using this technique.

In addition, one aspect of the invention facilitates determining an appropriate correction to an image impedance by directly measuring an impedance mismatch. This aspect facilitates optional continuous monitoring and adjustment of the image impedance. A particular embodiment of the invention uses current transformers in its matching circuitry, which protect the control circuitry from high voltage conditions on the line. One approach facilitates direct measurement of the impedance mismatch in systems where the signal being communicated shares a transmission medium with the system's power source, such as in digital subscriber line, Home Phoneline Networking Alliance (HPNA) devices, HomePlug (power line LAN), or cable television.

Particular embodiments of the invention provide an advantage of fault tolerant operation. For example, by using image impedances comprising a combination of fixed and variable portions, the system can maintain some level of operation even where the image impedance adjusting circuitry malfunctions or is otherwise unavailable. Particular embodiments also facilitate providing an improved dynamic range of the matching circuitry by using combinations of variable image impedance elements.

Other technical advantages are readily apparent to one of skill in the art from the attached figures, description, and claims.

BRIEF DESCRIPTION OF THE DRAWINGS

For a more complete understanding of the present invention, and for further features and advantages thereof, reference is now made to the following description taken in conjunction with the accompanying drawings, in which:

FIGS. 2–5 are block diagrams showing various example embodiments of network elements including circuitry operable to perform dynamic impedance matching; and FIG. 6 is a flow chart showing one example of a method of dynamically matching impedances.

DETAILED DESCRIPTION OF THE INVENTION

Figure 1:
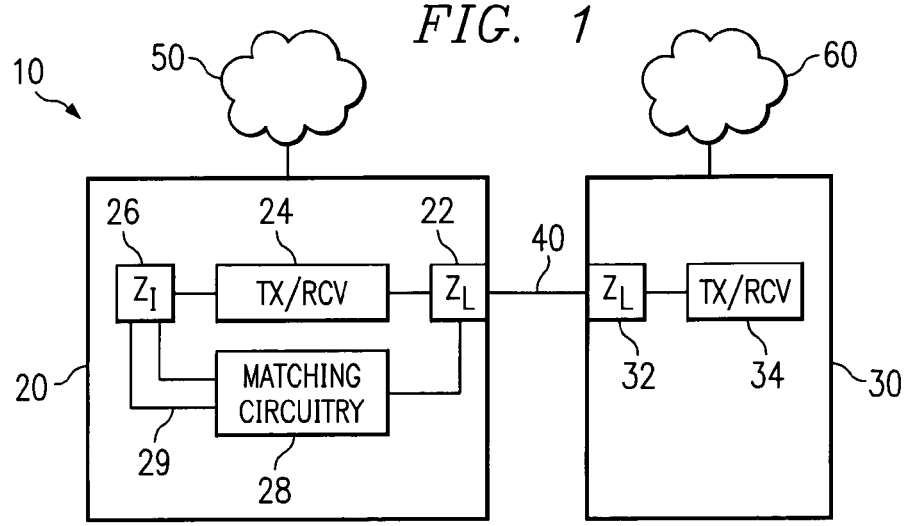
FIG. 1 is a block diagram of an exemplary embodiment of a system implementing a technique for dynamic impedance matching according to the teachings of the present invention.

FIG. 1 is a block diagram of an exemplary embodiment of a system 10 implementing a technique for dynamic impedance matching. System 10 includes a first network element 20 coupled to a second network element 30 by a communication link 40. Throughout this disclosure, the term "coupled" denotes direct or indirect communication between two or more items said to be "coupled." Items described as being "coupled" may or may not be physically connected to one another, and may or may not have other devices or elements residing between them.

Network elements 20 and 30 could comprise any hardware, firmware, software, or combination thereof operable to communicate with one another over one or more communication links 40. Network elements 20 and 30 could also communicate with other network elements over communication links or networks 50 and 60. In addition, communication devices besides network elements 20 and 30 may share communication link 40.

As one particular non-limiting example, network element 30 may comprise central office equipment and network element 20 could comprise customer premises equipment (such as digital subscriber line (DSL) modems, bridges, or routers, or cable modems) communicating with central office equipment 30 over communication link 40. Network element 20 could, however, comprise any communication device in which it is desirable to match an image impedance to a line impedance.

In the illustrated embodiment, each of network elements 20 and 30 includes a transmitter/receiver pair 24, 34, respectively. Transmitter/receiver pairs 24 and 34 facilitate communication between network elements 20 and 30 over communication link 40. In the embodiment shown in FIG. 1, communication link 40 comprises a physical medium or combination of physical media having a line impedance ($Z_L$). Communication link 40 may comprise, for example, a twisted pair of copper wires, a coaxial cable, or any other physical medium or combination of physical media having a line impedance associated with the communication of information over that medium.

Each of network elements 20 and 30 sees line impedance 22, 32 ($Z_L$) associated with communication link 40. To enhance system performance, it is desirable to provide a matching impedance. To that end, at least one of network elements 20 and/or 30 includes circuitry operable to dynamically match an image impedance $Z_I$ with the line impedance $Z_L$ associated with communication link 40. In another embodiment, both network elements 20 and 30, or just network element 30 could include a matching image impedance.

In this example, network element 20 includes an image impedance 26 ($Z_I$) coupled to transmitter/receiver pair 24. Image impedance 26 represents an impedance intended to match line impedance 22 so as to maximize or at least enhance the performance of network element 20. Image impedance 26 may comprise any components operable to undergo a change in impedance in response to one or more control signals. For example, image impedance 26 may include passive elements such as one or more comparitor controlled resistor ladders. As another example, image impedance 26 could comprise one or more active elements having an impedance proportional to a voltage applied to the element, such as a metal-oxide-semiconductor field effect transistor (MOSFET), a bipolar junction transistors (BJT), a switched analog switch, and/or analog gain control circuitry.

Image impedance 26 may comprise purely resistive elements to facilitate matching the real portions of the impedances, or a combination of resistive and reactive elements (such as capacitors and/or inductors) to facilitate complex impedance matching.

In this example, matching circuitry 28 is coupled between line impedance 22 and image impedance 26. Matching circuitry 28 operates to determine an impedance difference between line impedance 22 and image impedance 26 and to generate a control signal 29 based on that difference. Control signal 29 may comprise a voltage signal or a current signal, depending on the particular implementation. Control signal 29 operates to cause a change in image impedance 26 so that it more closely matches line impedance 22. Control signal 29 may directly affect image impedance 22, or may first be received by, for example, a microprocessor or other device that interfaces with image impedance 26.

System 10 facilitates comparison between the line impedance $Z_L$ and the image impedance $Z_I$ to determine a corrective control signal used to change the value of the image impedance $Z_I$ to more closely approximate the line impedance $Z_L$. In this way, system 10 can improve the geographic range of transmission between network elements 20 and 30 and/or increase the performance of the communication system for a given range. In a particular embodiment, system 10 facilitates continuous monitoring of differences between a line impedance and an image impedance, and adjustment of the image impedance to more closely match the line impedance.

Figure 2:
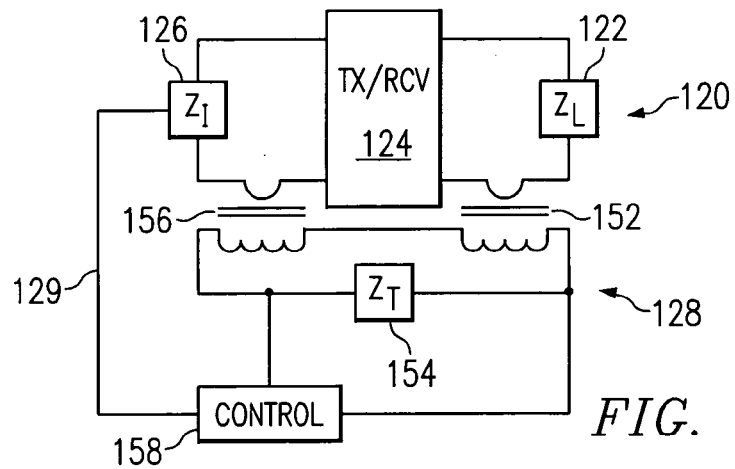

FIG. 2 is a block diagram showing one example embodiment of a network element 120 including circuitry operable to perform dynamic impedance matching. Network element 120 could comprise any communication device in which it is desirable to match an image impedance to a line impedance to enhance system performance.

Like the example shown in FIG. 1, network element 120 includes a transmitter/receiver pair 124 which sees a line impedance ($Z_L$) 122 associated with a communication link 40 coupled to network element 120. Network element 120 further includes an image impedance ($Z_I$) 126 coupled to transmitter/receiver pair 124. Image impedance 126 is intended to match line impedance 122 to facilitate enhanced performance of network element 120. Transmitter/receiver pair 124 may interface with communication link 40 and/or image impedance 126 through any suitable line isolation mechanism, such as a two transformer hybrid.

Network element 120 includes matching circuitry 128 operable to determine an impedance difference between line impedance 122 and image impedance 126, and to generate a control signal 129 based on that difference. In this particular example, matching circuitry 128 includes a first current transformer 152 coupled to line impedance 122 and a second current transformer 156 coupled to image impedance 126. As a particular example, current transformers 152 and 156 could each comprise a wide band current transformer. In this example, each current transformer 152 and 156 implements a 1:1 turns ratio. Other turns ratios could be used to provide various scaling factors. A 1:1 turns ratio is used in this example only for ease of description and is not intended to limit the scope of the invention.

Matching circuitry 128 also includes a termination impedance 154 ($Z_T$) coupled between first and second current transformers 152 and 156. Termination impedance 154 may comprise any resistive, reactive, or combination of resistive and reactive components. Although termination impedance 154 is shown as being a single block coupled in series with first and second current transformers 152 and 156, termination impedance 154 could alternatively comprise a network of resistive and/or reactive elements coupled to first and second current transformers 152 and 156. Through appropriate selection of the turns ratios of current transformers 152 and 156 and placement and component selection of termination impedance 154, various scaling factors can be achieved. For ease of description, this example uses a single termination impedance element 154 coupled in series between first current transformer 152 and second current transformer 156.

Matching circuitry 128 also includes control circuitry 158. In this example, control circuitry 158 comprises a voltage differential sensing device coupled across termination impedance 154. Control circuitry 158 operates to sense a voltage drop across termination impedance 154 and to generate control signal 129 based on that voltage drop. Control circuitry 158 may comprise, for example, an operation amplifier, one or more transistors, a microprocessor, or any other device or combination of devices operable to detect a voltage differential and generate a control signal based on that differential.

Control circuitry 158 communicates control signal 129 to image impedance 126. Image impedance 126 comprises an element operable to vary its impedance depending on control signal 129, either directly or in response to a signal derived from control signal 129. In this example, control signal 129 comprises a voltage signal. In that case, image impedance 126 could comprise, for example, a passive resistive element, such as a resistor ladder; or an active resistive element, such as a MOSFET or BJT or network of those devices. In addition, image impedance 126 could comprise a complex impedance including resistive and reactive components operable to facilitate complex impedance matching.

One aspect of the invention recognizes that if image impedance 126 is matched in phase and magnitude to line impedance 122, then the current through image impedance 126 will match the current through line impedance 122, regardless of any voltages associated with transmitter/receiver pair 124. Where image impedance 126 does not exactly match line impedance 122, the currents through those elements will differ. Matching circuit 128 uses current transformers 152 and 156 to transfer the currents associated with image impedance 126 and line impedance 122 to matching circuit 128. Any difference in those currents will result in a nonzero current through matching circuitry 128 and a voltage drop across termination impedance 154. In operation of this embodiment, control circuitry 158 monitors the voltage drop across termination impedance 154 and generates control signal 129 based on that voltage difference. Control signal 129 is used to vary image impedance 126 to more closely match line impedance 122.

Matching circuitry 128 provides significant advantages over other impedance matching approaches. For example, current transformers 152 and 156 provide natural isolation for control circuitry 158 from any high voltage signals associated with communication link 40 and/or transmitter/receiver pair 124. In this manner, matching circuit 128 allows control circuitry 158 to survive environmental high voltage events such as power cross and lightning strikes. In addition, this aspect of the invention facilitates direct measurement of the impedance mismatch in systems where the signal being communicated shares a transmission medium with the system's power source, such as in digital subscriber line, HPNA, or cable TV.

Moreover, matching circuit 128 facilitates impedance matching for any arbitrary impedance mismatch. This can provide significant advantages over systems relying solely on impedance matching tables, which are inherently limited to a finite number of impedance matching values. Matching circuit 128 not only eliminates or reduces the need for costly and complex impedance matching tables, but also facilitates matching of any arbitrary impedance mismatch. This feature can be valuable, for example, in situations resulting from impedance mismatches on line that do not have representative impedances. For example, impedance mismatches caused by discontinuities in wire gage, discontinuities in the overall line, or mismatches caused by bridge taps along the line can be easily rectified using this technique.

Figure 3:
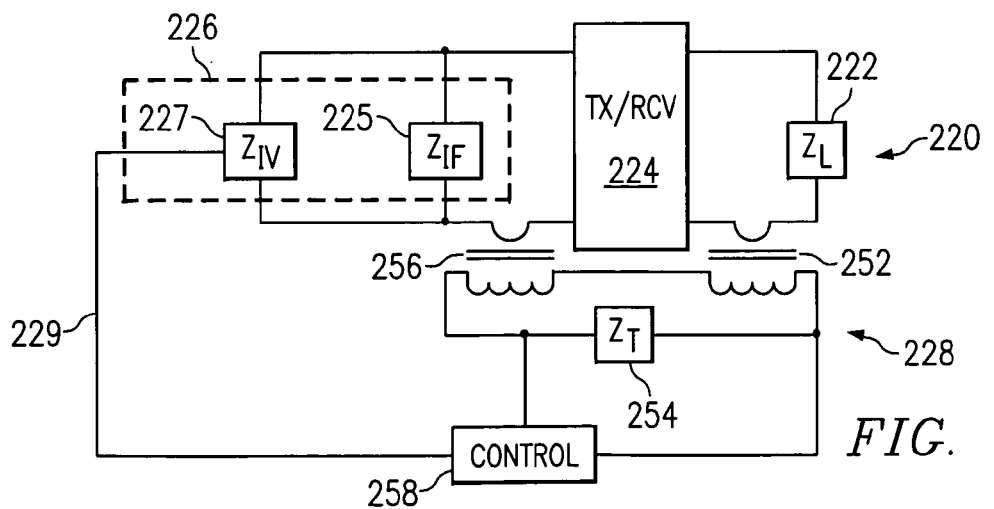

FIG. 3 is a block diagram showing another example embodiment of a network element 220 including circuitry operable to perform dynamic impedance matching. Network element 220 is similar in structure and function to network element 120 shown in FIG. 2. Network element 220 includes a transmitter/receiver pair 224, which sees a line impedance 222 associated with a communication link 40 coupled to network element 220. Network element 220 further includes an image impedance 226 coupled to transmitter/receiver pair 224. In this example, however, image impedance 226 comprises a parallel combination of a fixed image impedance ($z_{IF}$) 228 and a variable image impedance ($z_{IV}$) 227. Fixed image impedance 229 can comprise any impedance value. In this example, fixed image impedance 228 comprises an impedance selected as a best guess match for line impedance 222. Fixed image impedance 228 may comprise a purely resistive impedance, or a complex impedance.

Variable image impedance 227 can be controlled through application of a control signal 229. Control signal 229 is generated by matching circuitry 228, which in this example comprises a pair of wide band current transformers 252 and 256 coupled to a termination impedance 254, and control circuitry 258 coupled across all or a portion of termination impedance 254.

Variable image impedance 227 can vary from an infinite impedance down to any impedance that, when combined in parallel with fixed image impedance 228, matches the combined image impedance 226 based on the level of that impedance near the time control signal 229 is generated.

In this example, fixed image impedance 228 is selected to have an impedance that is somewhat larger than line impedance 222. By selecting fixed image impedance 229 to be higher than line impedance 222, the parallel combination of fixed and variable image impedances can be reduced by reducing the impedance of variable image impedance 227 through application of control signal 229. The quiescent impedance of variable image impedance 227 can be set to provide a combined image impedance 226 that theoretically matches line impedance 222. Then control signal 229 can be used to increase or decrease variable image impedance 227 to provide for granular adjustments to combined image impedance 226 as line impedance 222 varies over time or by circumstance.

Implementing fixed image impedance 229 in combination with variable image impedance 227 provides an advantage of reducing the required dynamic range of matching circuitry 228 by facilitating granular impedance adjustments around the best guess value represented by fixed image impedance 229. In addition, this embodiment provides fault tolerant operation in the event that matching circuitry 228 and/or variable image impedance 227 malfunctions. In that event, fixed image impedance 229 remains in the circuit and facilitates at least an impedance match that is a best guess estimate with line impedance 222. In short, the embodiment depicted in FIG. 3 retains all advantages of approaches implementing a fixed image impedance value, while also facilitating optional continuous adjustment of the image impedance and the ability to impedance match regardless of line irregularities or high voltage conditions.

FIG. 4 is a block diagram showing still another example embodiment of a network element 320 including circuitry operable to perform dynamic impedance matching. Network element 320 includes a transmitter/receiver pair 324, which sees a line impedance 322. An image impedance 326 is coupled to transmitter receiver pair 324, which attempts to match line impedance 322. In this embodiment, image impedance 326 comprises a fixed image impedance 329 coupled in series with a variable image impedance 327. Like the example shown in FIG. 3, fixed image impedance 329 can be any value. For example, fixed image impedance 329 can be selected to be a best guess estimate of line impedance 322. Variable image impedance 327 can comprise any impedance ranging from zero to an impedance which, when combined with fixed impedance 329, closely or exactly matches line impedance 322.

Variable image impedance 327 operates under the control of a control signal 329, which is generated by matching circuitry 328. Matching circuitry 328, in this example, comprises a pair of wide band current transformers 352 and 356 coupled to line impedance 322 and image impedance 326, respectively. Matching circuit 328 further includes a termination impedance 354 coupled to current transformers 352 and 356. Control circuitry 358 measures the voltage drop across termination impedance 354 to estimate any impedance mismatch between line impedance 322 and image impedance 326.

In a particular embodiment, fixed image impedance 329 can be set to a value lower than line impedance 322 so that, when combined with variable image impedance 327, combined image impedance 326 can be adjusted to more closely match line impedance 322. Like the example shown in FIG. 3, this embodiment provides an advantage of reducing the necessary dynamic range of matching circuitry 328 by using variable image impedance 327 to make only granular adjustments to the best guess fixed image impedance 329. In addition, this embodiment can be used to provide periodic impedance matching, or matching on a continuous basis. Moreover, like the example shown in FIG. 3, this embodiment provides fault tolerant impedance matching in the event that matching circuitry 328 malfunctions or in the event that variable image impedance 327 shorts.

FIG. 5 is a block diagram showing yet another example embodiment of a network element 420 including circuitry operable to perform dynamic impedance matching. Network element 420 includes a transmitter/receiver pair 424, which sees a line impedance 422, and is coupled to an image impedance 426. In this example, image impedance 426 comprises a plurality of variable image impedances 427a–427b coupled in parallel. In addition, image impedance 426 includes a fixed image impedance 429 coupled in series with at least one of variable image impedances 427.

Fixed image impedance 429 can be a purely resistive or a complex impedance. The value of fixed image impedance 429 can be selected, for example, as a best guess estimate of line impedance 422. Variable image impedances 427a and 427b can be selectively altered through control signals 429a and 429b, respectively.

Control signals 429 are generated by matching circuitry 428. In this example, matching circuitry 428 includes a pair of wide band current transformers 452 and 456 coupled to line impedance 422 and image impedance 426, respectively. Matching circuitry 428 also includes a termination impedance 454 coupled to current transformers 454 and 456. Termination impedance 454 may comprise a purely resistive element or network of elements, or may comprise a combination of resistive and reactive elements.

Control circuitry 458, in this example, measures a voltage difference across termination impedance 454 to generate control signals 429. In this example, control circuitry 458 comprises two separate control elements 458a and 458b, each operable to generate one of control signals 429a and 429b. Alternatively, signals 429a and 429b could be generated using a single control circuitry. Using separate control circuitry elements to generate each of signals 429a and 429b can provide an advantage of increasing the flexibility of the impedance matching system. For example, each of control elements 458a and 458b can be configured to respond to particular signal frequencies. In this manner, control signals 429a and 429b can be used to provide impedance matching at selected and/or various operating frequencies.

Configuring image impedance 426 to include multiple variable image impedances provides an advantage of facilitating a broader control range both above and below a nominal or expected line impedance value. For example, when image impedance 426 falls below line impedance 422, control signal 429a can increase image impedance 427a coupled in series with fixed image impedance 429, thereby increasing the combined impedance of image impedance 426. Where, for example, it becomes necessary to reduce image impedance 426, control signal 429b can operate to reduce variable impedance 427b coupled in parallel with fixed image impedance 429, thus reducing the parallel combination of those impedances and the total impedance of image impedance 426.

Although FIGS. 2–5 have shown particular examples of embodiments of dynamic impedance matching circuitry, various modifications can be made without departing from the scope of the invention. For example, other combinations of fixed and variable image impedances in other configurations could be used. In addition, although fixed and variable image impedances have been shown in the diagrams as single blocks, each of those elements could comprise a combination of multiple resistive and/or reactive elements. Moreover, although control signals to the image impedances have been described as voltage signals, current signals could also be used without departing from the scope of the invention.

FIG. 6 is a flow chart showing one example of a method 500 of dynamically matching impedances. Method 500 begins at step 510, where matching circuitry 28 measures an impedance mismatch between line impedance 22 and image impedance 26. In one particular embodiment, matching circuitry 28 may determine an impedance mismatch by observing a voltage drop across a termination impedance coupled between current transformers that deliver currents proportional to currents associated with the line impedance 22 and image impedance 26.

Based on the impedance mismatch, matching circuitry 28 generates one or more control signals 29 at step 520. This may include, for example, control circuitry associated with matching circuitry 28 identifying a voltage drop across termination impedance 54, and using that voltage difference, or a signal derived from that voltage difference as a control signal 29.

Matching circuitry 28 communicates control signal(s) 29 to image impedance 26 to change image impedance 26 at step 530. Image impedance 26 may comprise one or more fixed portions and one or more variable portions. Control signals 29 operate to directly or indirectly affect a change in the impedance of one or more variable portions of image impedance 26, so that image impedance 26 more closely matches line impedance 22.

Although the present invention has been described in several embodiments, a myriad of changes, variations, alterations, transformations, and modifications may be suggested to one skilled in the art, and it is intended that the present invention encompass such changes, variations, alterations, transformations, and modifications as fall within the spirit and scope of the appended claims.

What is claimed is:

1. A communication device including circuitry operable to facilitate dynamic impedance matching, the circuitry comprising:

an image impedance operable to be coupled to a receiver/transmitter pair associated with a line impedance;

matching circuitry coupled to the line impedance and the image impedance, the matching circuitry comprising;

a first current transformer coupled to the line impedance and operable to transfer a first current associated with the line impedance to a termination impedance for the matching circuitry;

a second current transformer coupled to the image impedance and operable to transfer a second current associated with the image impedance to the termination impedance for the matching circuitry, the termination impedance coupled between the first and second transformers; and a first control circuit coupled to the first and second current transformers, the first control circuit operable to detect a current mismatch between the first and second currents, to generate a first control signal based at least in part on the detected current mismatch, and to communicate the first control signal to at least a portion of the image impedance; and a second control circuit coupled to the first and second current transformers, the second control circuit operable to detect a current mismatch between the first and second currents, to generate a second control signal based at least in part on the detected current mismatch, and to communicate the second control signal to at least a portion of the image impedance, wherein at least one of the first and second control circuits is coupled in parallel with the termination impedance;

wherein the image impedance is operable to be varied to more closely match the line impedance based at least in part on the first and second control signals.

2. The communication device of claim 1, wherein the control circuitry measures a voltage drop across the termination impedance.

3. The communication device of claim 2, wherein the termination impedance comprises one or more resistive elements.

4. The communication device of claim 3, wherein the termination impedance comprises one or more reactive elements coupled to the one or more resistive elements.

5. The communication device of claim 1, wherein the image impedance comprises a passive resistive element.

6. The communication device of claim 1, wherein the image impedance comprises an active resistive element.

7. The communication device of claim 1, wherein the image impedance comprises a complex impedance comprising a combination of at least one resistive element and at least one reactive element.

8. The communication device of claim 1, wherein the image impedance comprises:

a fixed impedance; and a variable impedance coupled to the fixed impedance, the variable impedance operable to receive the control signal and vary its impedance depending on the control signal.

9. The communication device of claim 8, wherein the variable impedance is coupled in series with the fixed impedance, and wherein the fixed impedance comprises a smaller impedance than the line impedance.

10. The communication device of claim 8, wherein the variable impedance is coupled in parallel with the fixed impedance, and wherein the fixed impedance comprises a larger impedance than the line impedance.

11. The communication device of claim 1, wherein the image impedance comprises:

a first variable impedance coupled in series with a fixed impedance and operable to receive the first control signal from the control circuitry; and a second variable impedance coupled in parallel with the series combination of the first variable impedance and the fixed impedance, the second variable impedance operable to receive the second control signal from the control circuitry.

12. A communication device comprising circuitry operable to facilitate dynamic impedance matching, the circuitry comprising:

a first current transformer coupled to a line impedance and operable to transfer a first current associated with the line impedance to the matching circuitry;

a second current transformer coupled to an image impedance and operable to transfer a second current associated with the image impedance to the matching circuitry;

a termination impedance coupled between the first and second current transformers and operable to receive the first current and the second current; and a first control circuit coupled to the termination impedance, the first control circuit operable to detect a voltage drop across the termination impedance, to generate a first control signal based at least in part on the voltage drop across the termination impedance, and to communicate the first control signal to at least a portion of the image impedance; and a second control circuit coupled to the termination impedance, the second control circuit operable to detect the voltage drop across the termination impedance, to generate a second control signal based at least in part on the voltage drop across the termination impedance, and to communicate the second control signal to at least a portion of the image impedance, wherein at least one of the first and second control circuits is coupled in parallel with the termination impedance;

wherein the first and second control signals are operable to affect a change in the image impedance so that the image impedance more closely matches the line impedance.

13. The communication device of claim 12, wherein the image impedance comprises:

a fixed impedance; and a variable impedance coupled to the fixed impedance, the variable impedance operable to receive the control signal and vary its impedance depending on the control signal.

14. The communication device of claim 13, wherein the variable impedance is coupled in series with the fixed impedance, and wherein the fixed impedance comprises a smaller impedance than the line impedance.

15. The communication device of claim 14, wherein the variable impedance is coupled in parallel with the fixed impedance, and wherein the fixed impedance comprises a larger impedance than the line impedance.

16. The communication device of claim 14, wherein the image impedance comprises:

a first variable impedance coupled in series with a fixed impedance and operable to receive the first control signal from the control circuitry; and a second variable impedance coupled in parallel with the series combination of the first variable impedance and the fixed impedance, the second variable impedance operable to receive the second control signal from the control circuitry.

17. A method of dynamically matching impedances, comprising:

measuring an impedance mismatch between a line impedance and an image impedance, wherein measuring the impedance mismatch comprises measuring a voltage drop across a termination impedance coupled between a first current transformer delivering a current associated with the line impedance and a second current transformer delivering a current associated with the image impedance, and wherein the voltage drop across the termination impedance is measured by a first control circuit coupled to the termination impedance and a second control circuit coupled to the termination impedance, wherein at least one of the first and second control circuits is coupled in parallel with the termination impedance;

generating, using the first control circuit, a first control signal based at least in part on the voltage drop across the termination impedance;

generating, using the second control circuit, a second control signal based at least in part on the voltage drop across the termination impedance; and communicating the first and second control signals to at least a portion of the image impedance to cause the image impedance to more closely match the line impedance.

18. The method of claim 17, wherein the termination impedance comprises one or more resistive elements.

19. The method of claim 17, wherein the termination impedance comprises one or more reactive elements coupled to the one or more resistive elements.

20. The method of claim 17, wherein the image impedance comprises a passive resistive element.

21. The method of claim 17, wherein the image impedance comprises an active resistive element.

22. The method of claim 17, wherein the image impedance comprises a complex impedance comprising a combination of at least one resistive element and at least one reactive element.

23. The method of claim 17, wherein the image impedance comprises:

a fixed impedance; and a variable impedance coupled to the fixed impedance, the variable impedance operable to receive the control signal and vary its impedance depending on the control signal.

24. The method of claim 23, wherein the variable impedance is coupled in series with the fixed impedance, and wherein the fixed impedance comprises a smaller impedance than the line impedance.

25. The method of claim 23, wherein the variable impedance is coupled in parallel with the fixed impedance, and wherein the fixed impedance comprises a larger impedance than the line impedance.

26. A method of manufacturing circuitry operable to facilitate dynamic impedance matching, the method comprising:

coupling an image impedance to a receiver/transmitter pair associated with a line impedance;

coupling matching circuitry to the line impedance and the image impedance, wherein coupling the matching circuitry to the line impedance and the image impedance comprises:

coupling a first current transformer associated with matching circuitry to the line impedance, the first current transformer operable to transfer a first current associated with the line impedance to a termination impedance of the matching circuitry;

coupling a second current transformer associated with the matching circuitry to the image impedance, the second current transformer operable to transfer a second current associated with the image impedance to the termination impedance of the matching circuitry, the termination impedance coupled between the first and second transformers; and coupling a first control circuit to the first and second current transformers, the first control circuit operable to detect a current mismatch between the first and second currents, to generate a first control signal based at least in part on the detected current mismatch, and to communicate the first control signal to at least a portion of the image impedance; and coupling a second control circuit to the first and second current transformers, the second control circuit operable to detect a current mismatch between the first and second currents, to generate a second control signal based at least in part on the detected current mismatch, and to communicate the second control signal to at least a portion of the image impedance, wherein at least one of the first and second control circuits is coupled in parallel with the termination impedance;

coupling the matching circuitry to the image impedance to facilitate communication of the first and second control signals toward the image impedance and adjustment of the image impedance to more closely match the line impedance.

27. The method of claim 26, wherein the control circuitry is operable to determine a voltage drop across the termination impedance, the voltage drop being proportional to the current mismatch between the line impedance and the image impedance.

28. A method of dynamically matching impedances, comprising:

measuring an impedance mismatch between a line impedance and an image impedance, wherein measuring the impedance mismatch comprises measuring a current mismatch between a first current generated by a first current transformer that is associated with the line impedance and a second current generated by a second current transformer that is associated with the image impedance, and wherein the current mismatch is measured by a first control circuit coupled to the first and second current transformers and a second control circuit coupled to the first and second current transformers, wherein at least one of the first and second control circuits is coupled in parallel with a termination impedance that receives the first and second currents;

generating, using the first control circuit, a first control signal based at least in part on the detected current mismatch;

generating, using the second control circuit, a second control signal based at least in part on the current mismatch; and communicating the first and second control signals to at least a portion of the image impedance to cause the image impedance to more closely match the line impedance.

* * * * *